United States Patent
Yu et al.

(10) Patent No.: US 8,326,583 B2
(45) Date of Patent: Dec. 4, 2012

(54) CAD SYSTEM AND METHOD FOR BLEND RECOGNITION AND CHAIN SORTING IN A BREP MODEL

(75) Inventors: Feng Yu, Irvine, CA (US); Yu (Peggy) Xia, Shanghai (CN); Ying (Tina) Lin, Shanghai (CN); Eric Mawby, Windham, NH (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 472 days.

(21) Appl. No.: 12/617,184

(22) Filed: Nov. 12, 2009

(65) Prior Publication Data
US 2010/0305906 A1    Dec. 2, 2010

Related U.S. Application Data

(60) Provisional application No. 61/182,462, filed on May 29, 2009.

(51) Int. Cl.
*G06F 17/50* (2006.01)
(52) U.S. Cl. .......................................................... 703/1
(58) Field of Classification Search ...................... 703/1
See application file for complete search history.

(56) References Cited

U.S. PATENT DOCUMENTS

| 6,133,922 | A | * | 10/2000 | Opitz ........................... 345/420 |
| 7,236,168 | B2 | | 6/2007 | Venkataraman et al. |
| 7,830,377 | B1 | * | 11/2010 | Desimone et al. ............ 345/420 |
| 2002/0180729 | A1 | * | 12/2002 | Venkataraman et al. ..... 345/420 |
| 2004/0257362 | A1 | | 12/2004 | Venkataraman et al. |
| 2007/0027665 | A1 | * | 2/2007 | Maille et al. ...................... 703/6 |
| 2008/0174599 | A1 | * | 7/2008 | Rothstein et al. ............. 345/420 |
| 2010/0121626 | A1 | * | 5/2010 | Montana et al. .................. 703/6 |

FOREIGN PATENT DOCUMENTS

| EP | 1710720 A1 | 10/2006 |
| WO | WO 2008088369 A1 | 7/2008 |

OTHER PUBLICATIONS

Xiufen Cui, et al., "An Efficient Algorithm for Recognizing and Suppressing Blend Features", p. 421-428.
Venkataraman, Sashikumar, et al., "SM38: Removal of Blends from Boundary Representation Models", 12 pages.

* cited by examiner

*Primary Examiner* — Kandasamy Thangavelu
*Assistant Examiner* — Nithya Janakiraman

(57) ABSTRACT

A CAD system, method, and computer readable medium. A method includes loading a CAD object including a plurality of faces, and identifying a plurality of candidate faces from the plurality of faces. The candidate faces can include candidate blends. The method includes combining multiple ones of the candidate faces into a candidate blend chain, including at least one candidate blend. The method includes replacing the candidate blends with accurate blends to produce a corrected blend chain, and storing the corrected blend chain with the accurate blends as part of the CAD object.

20 Claims, 5 Drawing Sheets

CAD SYSTEM AND METHOD FOR BLEND RECOGNITION AND CHAIN SORTING IN A BREP MODEL

CROSS-REFERENCE TO OTHER APPLICATION

This application claims priority from U.S. Provisional Patent Application 61/182,462, filed May 29, 2009, which is hereby incorporated by reference.

TECHNICAL FIELD

The present disclosure is directed, in general, to computer-aided design, visualization, and manufacturing systems, and similar systems, referred to herein individually and collectively as "CAD systems."

BACKGROUND OF THE DISCLOSURE

In CAD systems, a "blend" is a surface used to smoothly connect two or more other surfaces.

SUMMARY OF THE DISCLOSURE

Various embodiments include CAD systems, methods, and computer readable mediums. In one embodiment, a method includes loading a CAD object including a plurality of faces, and identifying a plurality of candidate faces from the plurality of faces. The candidate faces can include candidate blends. The method includes combining multiple ones of the candidate faces into a candidate blend chain, including at least one candidate blend. The method includes replacing the candidate blends with accurate blends to produce a corrected blend chain, and storing the corrected blend chain with the accurate blends as part of the CAD object.

In some embodiments, each candidate face is one of a B-surface, partial cylinder, partial torus, partial sphere, blend, non-periodic extruded, or non-periodic revolved. In some embodiments, an accurate blend is a face having a cross section that is circular and of constant radius. In some embodiments, the CAD system identifies blend radii for each of the candidate blends, and groups the candidate faces according to the blend radii. In some embodiments, groups of connected candidate faces are combined into a candidate chain. In some embodiments, the CAD system identifies at least one blend-like face in a candidate chain, finds a radius and construction face of each of the blend-like faces, and recognizes the blend-like face as a blend. In some embodiments, the CAD system uses radii and construction faces for each of the faces in the corrected blend chain to apply a blend process to the CAD object. In some embodiments, the CAD system performs a corner blends handling process to recognize and correct at least one candidate blend that forms a corner between at least three faces. In some embodiments, the CAD system categorizes a candidate blend as one of a triangle corner face, a triangle-like corner, a variable-radius corner face, and a four-sided corner face. In some embodiments, the candidate blend that forms a corner is combined in a single chain with its neighboring faces.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

One synchronous modeling approach for design change emphasizes modifying the current state of a model without regard for how the model was constructed. Synchronous modeling is expected to perform in a source-independent manner, working equally well on models both native and foreign. Model geometry imported from foreign sources often includes sub-optimal conditions that hinder the success of synchronous modeling operations. Sub-optimal conditions need to be rectified in order to modify the geometry in a credible manner.

A "reblend" operation within synchronous modeling is used when a design face is changed. In a reblend, the surrounding blend faces are recomputed (reblended) to accommodate the change applied to the design face. In order to properly reblend, the CAD system must be able to recognize the blend faces as blends. Typically, blends created natively or within a completely-compatible CAD system are sufficiently accurate to recognize as blends. However, with imported geometry, the blend faces are frequently not accurate enough to recognize as blends, and so are considered not "well behaved."

A blend-like face might look like a blend but may not behave like a blend. That is, it fails to reblend because it is not a blend. If a blend-like face fails to reblend, the techniques described herein can replace it. To replace a blend-like face, the user can select the blend-like face, and the system will replace the blend-like face with a blend face using the methods described in detail below. Various embodiments disclosed herein can be used for blend recognition and processing.

Figure 1:
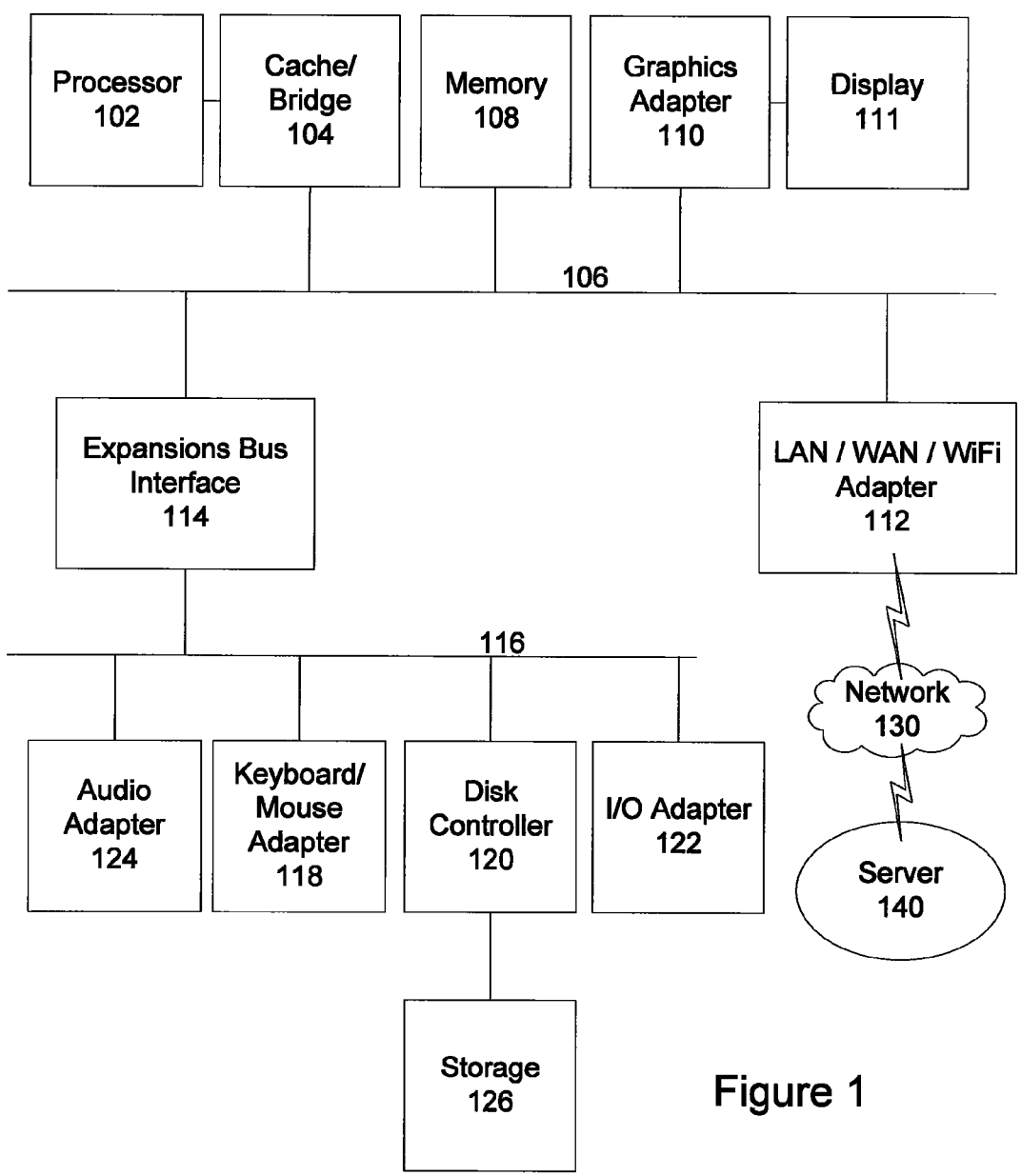
FIG. 1 depicts a block diagram of a data processing system in which an embodiment can be implemented.

FIG. 1 depicts a block diagram of a data processing system in which an embodiment can be implemented, for example as a CAD system for performing the blend-related processes described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

In a CAD system as discussed above, one condition to recognize a face as a blend is that the face must match the shape of a rolling ball. That is, the cross section of the blend face must be circular and constant radius. In most cases, a blend added natively or created in a completely-compatible CAD system matches the rolling ball form. A blend imported from a foreign source often does not. The foreign system may not impose the same accuracy ideals or the accuracy of a face may have been altered during translation, as the model is exported from one CAD system and into another. In many cases, blends in imported geometry are represented approximately as a boundary representation (Brep) surface (b-surface).

Even if an imported blend is represented as a b-surface, some CAD systems will recognize it as a blend if it matches rolling ball form within tolerance. However, a percentage of imported blends deviate from the rolling ball form beyond a reasonable tolerance. Another percentage is well beyond the shape of a rolling ball and is often not well-behaved, and not even visually recognizable as blends. In various embodiments, the tolerance discussed herein can be either an absolute value or a value relative to the size of the candidate blend face. A user can adjust the value based on the accuracy the user wants the model to have. The techniques described herein work particularly well for a tolerance smaller than 1/10 of the candidate face size.

Figure 2A:
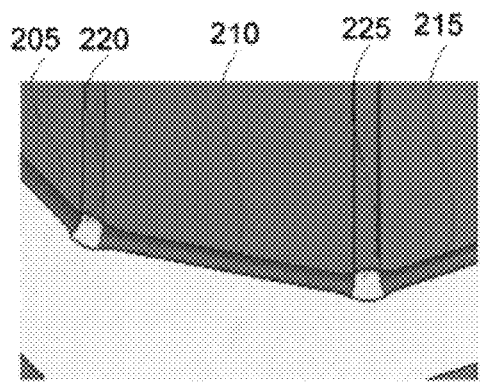
FIGS. 2A and 2B depict an example of blend geometry imported from a foreign source.
Figure 2B:
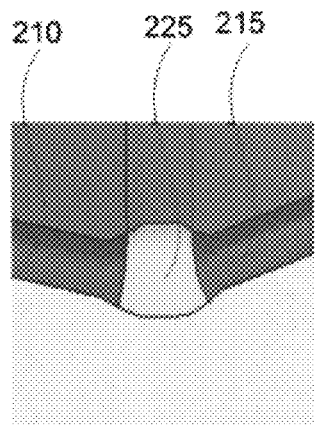

FIG. 2A depicts an example of blend geometry imported from a foreign source. Not knowing the definition of faces from the foreign source, the CAD system can assume that the end faces 205/210/215 and connecting faces 220/225 compose a "blend chain," a set of faces intended to be blended to form a smooth surface. FIG. 2B shows a close up of a portion of FIG. 2A. Here, the close-up image of the corner at connecting face 225 reveals that the blends do not match rolling ball form. The blends with end faces 210 and 215 "flair" where they meet the blends of connecting face 225, and the blends of connecting face 225 deviate substantially from the torus shape that would be expected from a proper blend.

Figure 3:
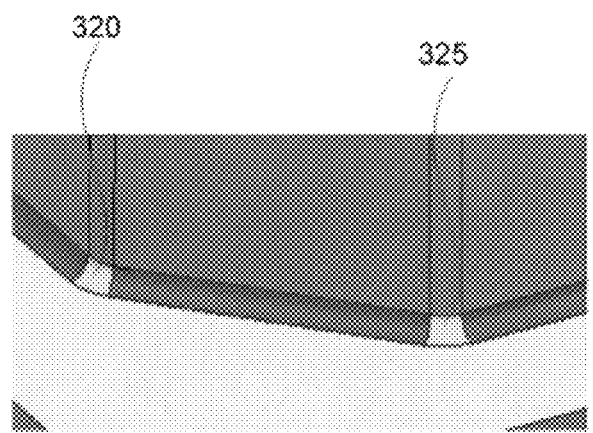
FIG. 3 depicts an example corresponding to that of FIG. 2A.

Disclosed embodiments include CAD systems and methods that recognize the chain of blend-like connecting faces for the purpose of replacing those faces with proper rolling-ball blends. For example the embodiments disclosed herein allow the system to recognize the blend chain of faces 205/220/210/225/215, and replace connecting faces 220/225 with rolling ball blends. FIG. 3 depicts an example corresponding to that of FIG. 2A, where accurate blends 320/325 have been put in place of corresponding connecting faces 220/225.

There are very few cases where a blend face exists in isolation of other blends. In a realistic model a blend is almost always a member of a chain of blends, and the blend chain is typically a member of a network of inter-dependent blends. As such, reblending a blend means the blend chain and its dependent blends participate in an extended reblend operation.

Imported blends represent challenges to successful reblend of a network. The challenge is compounded by the number of blends in the network. A blend chain by definition shares the same blend radius. Inaccuracy of radii of approximate b-surface blends may make it impossible to recognize a blend chain.

A corner blend is particularly challenging to recognize as a blend. There are various representations of corner blend which vary by the number of edges composing the corner, the convexity of the edges, and the radius of the edges. Corners are members of blend chain and necessary to the success of reblending a network of blends.

Figure 4:
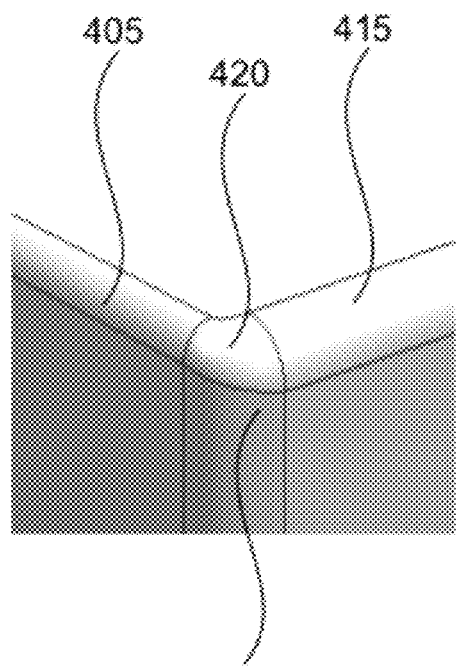
FIG. 4 shows another example of blend geometry imported from a foreign source.

FIG. 4 shows another example of blend geometry imported from a foreign source. The three blends 405/410/415 entering the face 420 of the corner are all different radius. The definition of the corner from the foreign source is a variable radius transition between the two smaller radii, rolling along the larger radius. The variable radius transition does not match rolling ball form.

Figure 5:
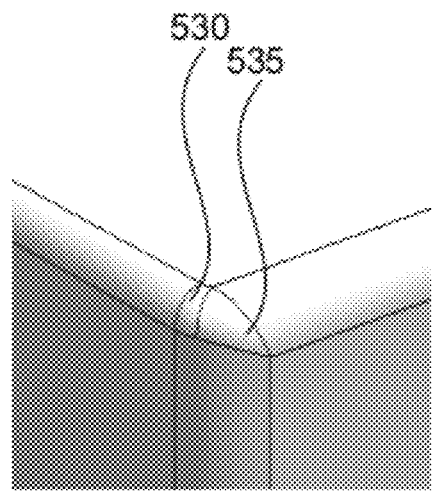
FIG. 5 shown an example corresponding to that of FIG. 4.

The CAD systems and methods described herein recognize the face 420 at the corner, determine the edge blends that compose the corner, their radius and convexity, and determine an order that will produce rolling ball blends at the corner, all for the purpose of replacing face 420 with rolling ball blends. FIG. 5 shown an example corresponding to that of FIG. 4, where the corner face 420 has been recognized by the CAD system and replaced with accurate rolling ball blends as faces 530/535.

Figure 6:
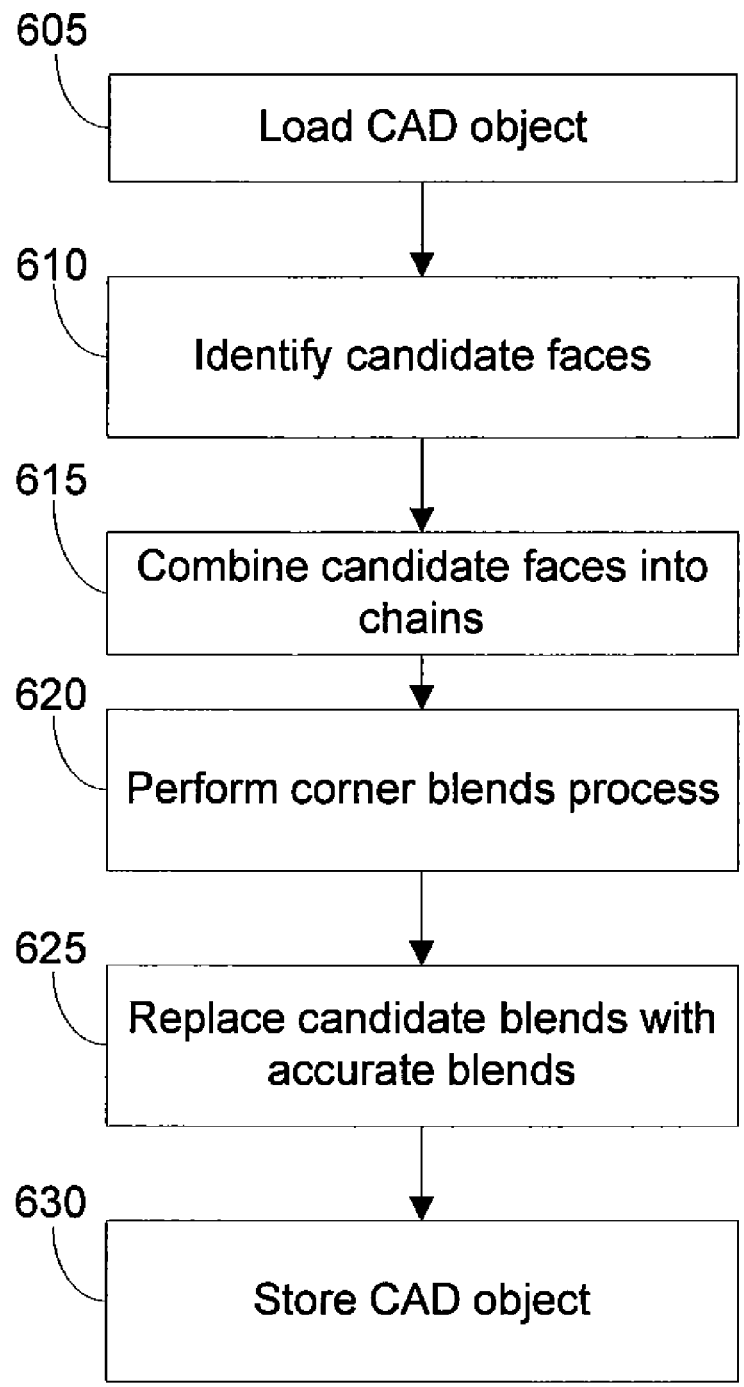
FIG. 6 depicts a flowchart of an overall process in accordance with disclosed embodiments.

FIG. 6 depicts a flowchart of an overall process in accordance with disclosed embodiments. Following are the particular definitions generally used in the description below, although those of skill in the art will recognize when the context requires a different use:

Candidate: B-surface, partial cylinder, partial torus, partial sphere, blend, non-periodic extruded, or non-periodic revolved.

Accurate Blend: A candidate that is accurate to the rolling ball form as described herein, or other otherwise an accurate blend by the requirements of the CAD system. In some embodiments, this can include blends that can be identified by a minimum tolerance.

Tolerant Blend: A candidate that is not an accurate blend but is recognized as blend with a reasonable tolerance. That is, within reasonable tolerance of the rolling ball form. In some embodiments, this can include blends that can be identified by a maximum tolerance but not by a minimum tolerance.

Blend-Like: A candidate that is not recognized as blend with a reasonable tolerance. In some embodiments, this can include blends that are Bsurf and swept faces that cannot be identified even with a maximum tolerance. Further, in some embodiments, blend-like faces are all processed as corners, and other faces can also be found when identifying corners.

According to at least one disclosed process, the CAD system loads a CAD object model including a plurality of faces (step 605). Loading, in this context, can include loading the object model from a storage, receiving it from another data processing system, for example over a network, receiving it from a user input, or other means recognized by those of skill in the art.

The CAD system analyzes the object model to identify candidate faces that can be part of a blend chain (step 610), including identifying one or more connecting faces blends in the blend chain.

In this step, the CAD system identifies a chain of connected candidate faces, that can include connecting faces including accurate blends, tolerant blends, and blend-like faces, as faces for a blend chain, and identifies the candidate blends in the chain. For each selected candidate face, the CAD system performs a blend recognition process with a reasonable pre-determined tolerance. If the face is recognized as an accurate blend or tolerant blend, the CAD system also performs the blend recognition process on each candidate face that connects to this candidate face. All the accurate and tolerant blends connected to the selected candidates are identified this way.

As the CAD system recognizes that candidate faces and blends, the CAD system also identifies the blend radii for each of the identified blends. The CAD system puts the collected candidates into groups of the same radii modulo the deviation associated with the recognition tolerance. One radius is to be used for each group, and can be determined in a way such that it can be reused on replay of the operation.

The CAD system designates each connected set of faces in a group of radius as a blend chain. For each of these chains, the CAD system can find the dependent blends and includes them in the chain to process together. The CAD system can merge multiple chains if one blend in a chain is a dependent of another chain or two chains are connected by a dependent blend.

Construction faces of each accurate and tolerant blend can also be determined in the process this step.

The CAD system then combines the selected candidates into chains (step 615). In this process, the CAD system also incorporates blend-like candidates into a chain. After the chains of accurate blends and tolerant blends are determined, the remaining selected candidates are the blend-like faces. For of the candidate blend-like faces, the CAD system find the accurate blends, tolerant blends and candidate blend-like faces that are connected to it. Based on the type of faces found, the CAD system propagates the recognition along the connected candidates to find the radius and construction faces of the blend-like face so that they can be recognized as a blend.

For example, if two connected candidates are found that are opposite to each other, these two candidates are treated as ones in the same chain. If a connected candidate is an accurate blend or tolerant blend, the CAD system obtains a radius from it. Otherwise, the CAD system performs the same process on the connected candidate until the radius is obtained. The other connected faces, that is, non-candidate faces, are treated as construction faces.

The CAD system put the selected blend-like face into the chain where the radius is found, and can merge the chains if selected blend-like faces connect them.

This provides a significant technical advantage over other systems, in which blend-like candidates are not recognized as blends. The processes described herein aggressively identify and process the blend-like faces to participate in a blend chain.

The CAD system performs a corner blends handling process (step 620). In this step, the CAD system can recognize and correct various types of corner blends. Most corner candidates in imported parts are blend-like in that they are not immediately recognizable as blends. The corners can be categorized into many types in terms of the connection to adjacent faces, the relative radius sizes of adjacent edge blends and the convexity of the corner. This step is optional, and if performed, can be performed concurrently with other steps.

Figure 7:
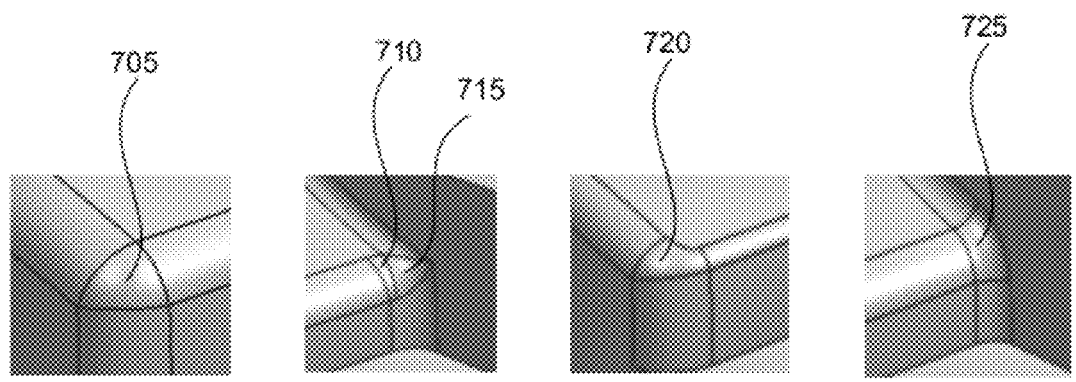
FIG. 7 illustrates four corner blend types that can be processed using the techniques disclosed herein.

FIG. 7 illustrates four corner blend types that can be processed using the techniques disclosed herein. These types can be further grouped, in some embodiments, into 4 large category sets that are handled separately in this step.

The triangle corner category includes a candidate face that is adjacent to three independent blends. A triangle-like corner category includes a candidate face adjacent to three dependent blends. A variable-radius corner category includes a candidate face that is adjacent to three independent blends with three variable radiuses and one non-blend face. A four-sided corner category includes a candidate face that is a branch face adjacent to three blends and one non-blend face.

These figures illustrate some of these categories, such as a triangle corner face 705, triangle-like corner with faces 710/715, a variable-radius corner face 720, and a four-sided corner face 725.

Other embodiments can also include a connected corner category that includes a candidate face that is a blend-like face adjacent to two blends in a chain and two non-blend faces which connects a "broken" chain. Of course, other faces can be non-corner faces.

Returning to step 620, for each selected candidate corner face, the CAD system determines to which of the corner categories the candidate belongs (as described with relation to FIG. 7), and processes the candidate based on the characteristics of the corner category to obtain the radius and construction face information.

For example, if the candidate blend is identified as belonging to a triangle category 705, the three adjacent faces are accurate blends, tolerant blends or selected blend-like faces. They are the construction faces of the corner. The respective radii of them are used to as the radius data for the corner. Processing is similar for each of the other corner categories; each corner category has an associated corner category definition that defines the number of adjacent faces and their radii that should be used for processing the corner blend.

When a corner is processed, its adjacent faces that are also candidates are processed together. The chains of the adjacent faces and the corner are merged into a single chain.

The CAD system replaces the candidate blends in the identified chains with complete, accurate blends (step 625); the chains can then be regarded as corrected blend chains. In this process, each of the candidates in each chain is replaced with accurate blends, created according to the radii and construction faces found in a previous step and according to the radii of neighboring faces. After all candidates are processed and put into independent chains, the CAD system replaces them with accurate blends, and stores the new surfaces and blends as part of the CAD object model (step 630).

For each chain, the CAD system uses the collected radii and construction faces as the input data to apply a blend process to blend all members together. The new faces are recognized as accurate blends, and can thereafter be re-blended when construction face change.

Those of skill in the art will recognize that not all embodiments require all steps to be performed, and that some steps can be performed in a different order or concurrently unless specifically indicated otherwise. The process of FIG. 6 can be performed by a CAD system, implemented in a CAD system particularly configured to perform such steps, and implemented by a computer-readable medium encoded with instructions that, when executed, cause a data processing system to perform such steps.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of a instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for use in a CAD system, comprising:
   loading a CAD object in a CAD system, the CAD object including a plurality of faces;
   identifying, by the CAD system, a plurality of candidate faces from the plurality of faces, the candidate faces including candidate blends, multiple ones of the candidate blends having different blend radii;
   combining, by the CAD system, multiple ones of the candidate faces into a candidate blend chain, including at least one candidate blend;
   replacing, by the CAD system, the candidate blends with accurate blends to produce a corrected blend chain, the accurate blends having the same blend radii; and
   storing the corrected blend chain with the accurate blends in the CAD system as part of the CAD object.

2. The method of claim 1, wherein each candidate face is one of a B-surface, partial cylinder, partial torus, partial sphere, blend, non-periodic extruded, or non-periodic revolved.

3. The method of claim 1, wherein an accurate blend is a face having a cross section that is circular and of constant radius.

4. The method of claim 1, wherein the CAD system identifies blend radii for each of the candidate blends, and groups the candidate faces according to the blend radii.

5. The method of claim 1, wherein groups of connected candidate faces are combined into a candidate chain.

6. The method of claim 1, wherein the CAD system identifies at least one blend-like face in a candidate chain, finds a radius and construction face of each of the blend-like faces, and recognizes the blend-like face as a blend.

7. The method of claim 1, wherein the CAD system uses radii and construction faces for each of the faces in the corrected blend chain to apply a blend process to the CAD object.

8. The method of claim 1, wherein the CAD system performs a corner blends handling process to recognize and correct at least one candidate blend that forms a corner between at least three faces.

9. The method of claim 8, wherein the CAD system categorizes at least one candidate blend as one of a triangle corner face, a triangle-like corner, a variable-radius corner face, and a four-sided corner face.

10. The method of claim 8, wherein the at least one candidate blend that forms a corner between at least three faces is combined in a single chain with the at least three faces.

11. A CAD system comprising a processor and accessible memory, the CAD system configured to perform the steps of:
loading a CAD object including a plurality of faces;
identifying a plurality of candidate faces from the plurality of faces, the candidate faces including candidate blends, multiple ones of the candidate blends having different blend radii;
combining multiple ones of the candidate faces into a candidate blend chain, including at least one candidate blend;
replacing the candidate blends with accurate blends to produce a corrected blend chain; and
storing the corrected blend chain with the accurate blends as part of the CAD object.

12. The CAD system of claim 11, wherein each candidate face is one of a B-surface, partial cylinder, partial torus, partial sphere, blend, non-periodic extruded, or non-periodic revolved.

13. The CAD system of claim 11, wherein an accurate blend is a face having a cross section that is circular and of constant radius.

14. The CAD system of claim 11, wherein the CAD system identifies blend radii for each of the candidate blends, and groups the candidate faces according to the blend radii.

15. The CAD system of claim 11, wherein the CAD system identifies at least one blend-like face in a candidate chain, finds a radius and construction face of each of the blend-like faces, and recognizes the blend-like face as a blend.

16. The CAD system of claim 11, wherein the CAD system uses radii and construction faces for each of the faces in the corrected blend chain to apply a blend process to the CAD object.

17. The CAD system of claim 11, wherein the CAD system performs a corner blends handling process to recognize and correct at least one candidate blend that forms a corner between at least three faces.

18. The CAD system of claim 17, wherein the CAD system categorizes at least one candidate blend as one of a triangle corner face, a triangle-like corner, a variable-radius corner face, and a four-sided corner face.

19. The CAD system of claim 17, wherein the at least one candidate blend that forms a corner between at least three faces is combined in a single chain with the at least three faces.

20. A non-transitory computer-readable medium encoded with computer-executable instructions that, when executed, cause a data processing system to perform the steps of:
loading a CAD object including a plurality of faces;
identifying a plurality of candidate faces from the plurality of faces, the candidate faces including candidate blends, multiple ones of the candidate blends having different blend radii;
combining multiple ones of the candidate faces into a candidate blend chain, including at least one candidate blend;
replacing the candidate blends with accurate blends to produce a corrected blend chain, the accurate blends having the same blend radii; and
storing the corrected blend chain with the accurate blends as part of the CAD object.

* * * * *